(12) United States Patent
Wong et al.

(10) Patent No.: US 10,886,913 B2
(45) Date of Patent: Jan. 5, 2021

(54) DRIVE METHOD AND DRIVE CIRCUIT FOR POWER SWITCH, AND POWER SUPPLY SYSTEM

(71) Applicant: Joulwatt Technology (Hangzhou) Co., Ltd., Hangzhou (CN)

(72) Inventors: Pitleong Wong, Hangzhou (CN); Libin Huang, Hangzhou (CN); Yuancheng Ren, Hangzhou (CN); Xunwei Zhou, Hangzhou (CN)

(73) Assignee: JOULWATT TECHNOLOGY (HANGZHOU) CO., LTD, Hangzhou (CN)

( * ) Notice: Subject to any disclaimer, the term of this patent is extended or adjusted under 35 U.S.C. 154(b) by 0 days.

(21) Appl. No.: 15/688,640

(22) Filed: Aug. 28, 2017

(65) Prior Publication Data

US 2018/0062641 A1 Mar. 1, 2018

(30) Foreign Application Priority Data

Aug. 29, 2016 (CN) .......................... 2016 1 0757563
Aug. 29, 2016 (CN) .......................... 2016 1 0757919

(51) Int. Cl.
*H03K 17/284* (2006.01)
*H03K 17/16* (2006.01)
*H03K 17/0416* (2006.01)

(52) U.S. Cl.
CPC ..... *H03K 17/284* (2013.01); *H03K 17/04163* (2013.01); *H03K 17/165* (2013.01)

(58) Field of Classification Search
CPC ............. H03K 17/0822; H03K 17/284; H03K 17/04163; H03K 17/165

USPC ......................................................... 327/380
See application file for complete search history.

(56) References Cited

U.S. PATENT DOCUMENTS 5,325,258 A * 6/1994 Choi .................. H03K 17/0828
324/276

FOREIGN PATENT DOCUMENTS

CN 103997194 A 8/2014
CN 206041787 U 3/2017

* cited by examiner

*Primary Examiner* — Lincoln D Donovan
*Assistant Examiner* — Colleen J O Toole
(74) *Attorney, Agent, or Firm* — Treasure IP Group, LLC

(57) ABSTRACT

Disclosed a drive method, a drive circuit for a power switch and a power supply system. During the turning-on period of the power switch, which can be roughly divided into three processes, a current limiting module is used to limit the current flowing through the power switch for preventing current overshoot, a logic control module is used for controlling the current limiting module not to operate before the turning-on period and the control terminal of the power switch is turned off; during the turning-on period, a feedback circuit adjusts the gate voltage of the power switch for controlling the current flowing through the power switch to reach a predetermined limited value quickly and then maintain at the limited value until the power switch is fully turned on. The current limiting module can be employed in various embodiments. According to the disclosure, the current flowing through the power switch can be effectively controlled during the turning-on period, and the driving time for turning on the power switch is decreased.

17 Claims, 10 Drawing Sheets

DRIVE METHOD AND DRIVE CIRCUIT FOR POWER SWITCH, AND POWER SUPPLY SYSTEM

CROSS-REFERENCE TO RELATED APPLICATION

This application claims the benefit of Chinese Patent Application No. 201610757563.4, filed on Aug. 29, 2016, and claims the benefit of Chinese Patent Application No. 201610757919.4, filed on Aug. 29, 2016, which are incorporated herein by reference in its entirety.

BACKGROUND OF THE DISCLOSURE

Field of the Disclosure

The present disclosure relates to the field of power electronics, and more particularly, to a drive method and a drive circuit for a power switch, and a power supply system.

BACKGROUND OF THE DISCLOSURE

In power supply systems, switching power transistors (i.e., power switch) are controlled to be turned on and off for converting electrical energy, and the control of switching frequency, input/output current and voltage are crucial to the electrical energy conversion. Thus, the control for driving the power switch is essential. As shown in FIG. 1, a buck circuit commonly used in power supply systems is taken as an example. A logic control circuit U01 samples an output voltage and compares it with an inner reference voltage, to generate a PWM signal for turning on and off a main switch M00, so that the output voltage generated by the power supply system is equal to the inner reference voltage. Because the main switch M00 has a large parasitic capacitance at gate electrode, a drive circuit U00 is required to drive the main switch M00.

FIG. 2 shows a conventional drive circuit mainly including several series inverters. The driving capacity of the inverters is increased gradually from left to right, that means, the driving capacity of U10 is weakest, and the driving capacity of U13 is strongest, so that U13 has a sufficient driving capacity to change the gate voltage of the main switch from low to high.

The above-described drive circuit controls the main switch from an off state to a fully on state when the PWM signal goes from low to high, and controls the main switch from the fully on state to the off state when the PWM goes from high to low. Because the drive circuit only takes the problem of driving capacity into account, the current is difficult to control during the turning-on period of the main switch. Due to the reverse recovery process of the freewheeling diode, the main switch and freewheeling diode produce a short time phenomenon similar to direct-connection, and the current flowing through the main switch and the current flowing through the diode are both out of control, which results in great current overshoot, so that system reliability and EMI performance are greatly affected. In order to prevent interference caused by current overshoot from the system, a certain blanking time is required, which starts from the time when the rising edge of the PWM signal occurs to the time with a certain delay after the main switch is fully turned on. During the blanking time, the logic control circuit does not detect the current flowing through the main switch. In the buck circuit, if the circuit from the SW point to ground is short-circuited, the current flowing through the main switch will run out of control, thereby causing damage to the main switch due to the current being too large. FIG. 3 is an operation waveform diagram of the buck circuit and FIG. 4 is an amplification waveform diagram showing the turning-on period of the buck circuit shown in FIG. 3. Other circuit topologies have similar waveforms. In FIG. 3, the part marked by the dashed line represents the waveform of the current overshoot when the main switch is turned on.

The technical scheme in the prior art increases the driving time for turning on the main switch, which results in a longer turning-on period, and thus, the system efficiency is reduced, and it is difficult to optimize the driving time for turning on the main switch. Meanwhile, because the driving speed varies with the factors such as the adoption of different switches and operating temperatures, specific devices are required for designing different driving delay time.

SUMMARY OF THE DISCLOSURE

In view of this, an objective of the disclosure is to provide a drive method and a drive circuit for a power switch and a power supply system, by which the current is controllable in the turning-on period of the power switch and the driving time for turning on the power switch is optimized. And thus, the prior technical problem, that the driving time is prolonged in order to prevent current overshoot, is solved.

According to a first aspect, the disclosure provides a drive method for a power switch, the turning-on period of the power switch comprises:

a first process, in which the power switch receives a control signal at a control terminal, when the control signal turns from an ineffective state to an effective state representing turning on, a voltage of the control terminal of the power switch starts to increase, as the voltage of the control terminal increases, the power switch begins to be gradually conductive, a current flowing through the power switch begins to increase to reach a predetermined limited value;

a second process, in which the voltage of the control terminal of the power switch is controlled for maintaining the current flowing through the power switch at the limited value, drain-source impedance of the power switch is reduced and drain-source voltage of the power switch gradually decreases; and a third process, in which the current flowing through the power switch decreases from the limited value to a normal operation value, the voltage of the control terminal of the power switch is pulled up again to reach a maximum value, and the power switch is fully turned on at the time.

Preferably, the method comprises: detecting the drain-source voltage of the power switch, wherein when the drain-source voltage gradually decreases to reach a first threshold value, the voltage of the control terminal of the power switch is quickly pulled up to fully turning on the power switch, that is, the drain-source voltage is used as a judgement index for accelerating a turning-on speed of the power switch.

Preferably, that the voltage of the control terminal of the power switch is controlled for maintaining the current flowing through the power switch at the limited value comprises: sampling the current flowing through the power switch, performing an error treatment on signals obtained by sampling and a predetermined reference value, and adjusting the voltage of the control terminal of the power switch for controlling the current flowing through the power switch equal to the limited value in accordance with the result of the error treatment.

Preferably, that the voltage of the control terminal of the power switch is controlled for maintaining the current flowing through the power switch at the limited value comprises: providing an auxiliary power switch, the auxiliary power switch and the controlled power switch constitute a current mirror which is used to maintain the current flowing through the power switch at the limited value by limiting the current flowing through the auxiliary power switch.

According to a second aspect, the disclosure provides a drive circuit with following structure for a power switch, comprising: a current limiting module, wherein the drive circuit receives a control signal, during a turning-on period, when the control signal turns from an ineffective state to an effective state representing turning on, a voltage of the control terminal of the power switch starts to increase, the current limiting module begins to operate, as the voltage of the control terminal increases, the power switch begins to be conductive gradually, the current flowing through the power switch is increased to reach a predetermined limited value under the adjustment of the current limiting module; the voltage of the control terminal of the power switch is controlled for maintaining the current flowing through the power switch at the limited value, the drain-source impedance of the power switch drops and the drain-source voltage of the power switch gradually decreases; and the current flowing through the power switch drops from the limited value to a normal operation value, the voltage of the control terminal of the power switch is pulled up again to reach a maximum value, and the power switch is fully turned on at the time.

Preferably, the drive circuit further comprises: a logic control module for receiving the control signal, wherein the logic control module controls the current limiting module not to operate and pulls down the voltage of the control terminal of the when the control signal is ineffective, and controls the current limiting module begin to operate when the control signal is effective.

Preferably, the current limiting module includes a first operational amplifier, the first operational amplifier has an first input terminal for receiving an current limiting reference signal, a second input terminal receiving a sampling signal representing the current flowing through the power switch, and an output terminal being connected with the control terminal of the power switch.

Preferably, the drive circuit further comprises: a voltage comparator, wherein the voltage comparator receives a drain-source voltage of the power switch, and compares the drain-source voltage with a predetermined first threshold value, when the drain-source voltage is smaller than the first threshold value, the voltage of the control terminal of the power switch is pulled up quickly to fully turn on the power switch.

Preferably, the drive circuit further comprises: a timing protection circuit, wherein a time threshold is set by the timing protection circuit when the current flowing through the power switch is maintained at the limited value, and when time is over the time threshold but the drain-source voltage does not begin to decrease, the power switch is controlled to be turned off for protecting the power switch.

Preferably, the current limiting module comprises an auxiliary power switch and a first operational amplifier, the auxiliary power switch and the controlled power switch constitute a current mirror, the first operational amplifier has a first input terminal for receiving a reference signal, a second input terminal being connected with a first terminal of the auxiliary power switch, and an output terminal being connected with the control terminal of the power switch, and the first terminal of the auxiliary power switch receives the current from a first current source when the control signal represents an effective state.

Preferably, the current limiting module comprises an auxiliary power switch and a first switch, the auxiliary power switch and the controlled power switch constitute a current mirror, the first switch has a first terminal for receiving a supply voltage, a second terminal being connected with the control terminal of the power switch, and an control terminal being connected with a first terminal of the auxiliary power switch, and the the first terminal of the auxiliary power switch receives the current from a first current source when the control signal represents an effective state.

Preferably, the first switch is an N-type MOS transistor.

Preferably, the current limiting module further comprises an auxiliary power switch, a second switch and a second operational amplifier, the auxiliary power switch and the controlled power switch constitute a current mirror, the second switch has a first terminal being connected with the control terminal of the power switch, a second terminal for receiving a supply voltage and a control terminal being connected with an output terminal of the second operational amplifier, the second operational amplifier has a first input terminal for receiving a reference signal and a second input terminal being connected with the first terminal of the power switch, and the the first terminal of the auxiliary power switch receives current from a first current source when the control signal represents an effective state.

Preferably, the current limiting module comprises an auxiliary power switch, a second switch and a second operational amplifier, the driver circuit adjusts the current flowing through the controlled power switch by adjusting the current flowing through the auxiliary power switch, the second operational amplifier has a first input terminal for receiving a reference signal representing a limited value of the current flowing through the auxiliary power switch, a second input terminal for receiving a sampling signal representing the current flowing through the auxiliary power switch, and an output terminal being connected with the control terminal of the power switch; the second operational amplifier has an output terminal being connected with a control terminal of the second switch; and the second switch has a first terminal being connected with the control terminal of the power switch and a second terminal for receiving a supply voltage.

Preferably, the second switch is a P-type MOS transistor.

According to a third aspect, the disclosure provides a power supply system having following structure, which comprises the above drive circuit for the power switch.

According to a fourth aspect, the disclosure provides a drive method for a switch, the turning-on period of the switch comprises:

a first process, in which the switch receives a control signal at a control terminal, when the control signal turns from an ineffective state to an effective state representing turning on, a gate-source voltage of the switch starts to decrease, the switch begins to be gradually conductive when the gate-source voltage decreases, a current flowing through the switch begins to increase and reaches a predetermined limited value;

a second process, in which the current flowing through the switch is maintained at the limited value by controlling the gate-source voltage of the switch, drain-source impedance of the switch drops and an absolute value of drain-source voltage of the switch gradually decreases; and a third process, in which the current flowing through the switch drops from the limited value to a normal operation value, the gate-source voltage of the switch drops again until the absolute value of the gate-source voltage reaches a maximum value, and the switch is fully conductive at the time.

Compared with the prior art, the circuit structure and method according to the present disclosure have following advantages. The turning-on period of the power switch can be roughly divided into three processes, in which the current flowing through the power switch is limited by use of a current limiting module for preventing current overshoot, a logic control module is used for controlling the current limiting module not to operate before the turning-on period and the control terminal of the power switch is turned off; during the turning-on period, a feedback circuit adjusts the gate voltage of the power switch for controlling the current flowing through the power switch to reach a predetermined limited value and then maintain at the limited value until the power switch is fully turned on. The current limiting module can be employed in various embodiments. According to the disclosure, the current flowing through the power switch can be effectively controlled during the turning-on period, and the driving time for turning on the power switch is reduced.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Reference will now be made in detail to particular embodiments of the disclosure, examples of which are illustrated in the accompanying drawings. It will be understood that the disclosure is not limited to these examples. On the contrary, the disclosure is intended to cover alternatives, modifications and equivalents that may be included within the spirit and scope of the disclosure as defined by the appended claims.

Furthermore, in the following detailed description of the present disclosure, numerous specific details are set fourth in order to provide a thorough understanding of the present disclosure. However, it will be readily apparent to one skilled in the art that the present disclosure may be practiced without these specific details.

Reference will now be made in detail to particular embodiments of the disclosure, examples of which are illustrated in the accompanying drawings. The accompanying drawings are illustrative and not intended to be limiting, but are examples of embodiments of the invention, which are simplified for explanatory purposes and are not drawn to scale.

Figure 5:
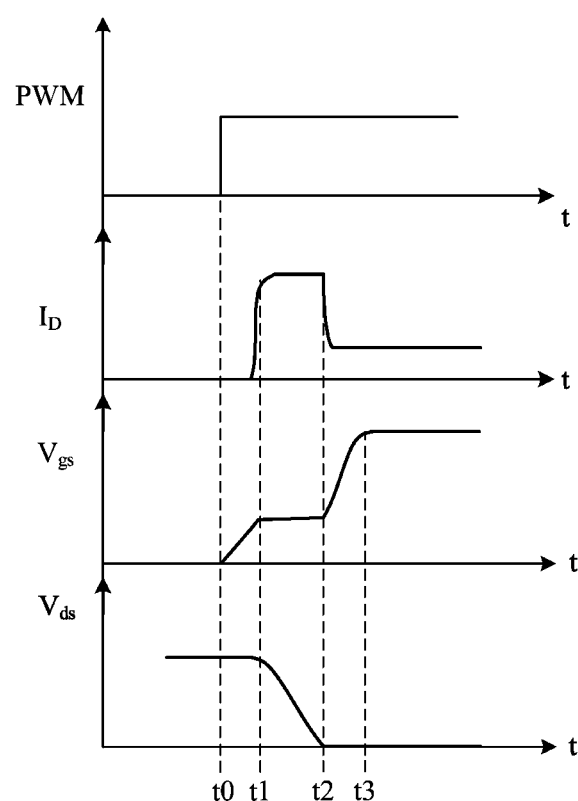
FIG. 5 is an operating waveform diagram according to an embodiment of the disclosure.

FIG. 5 shows waveforms of a PWM signal, a current $I_D$ flowing through a power switch, a gate-source voltage Vgs and a drain-source voltage Vds, including the main waveforms during turning-on period of the power switch. A PWM signal can be used as a manner of controlling a power switch. The PWM signal includes an effective part and an ineffective part, which constitute a switching cycle, the ratio of the effective part to the whole switching cycle is referred to as duty cycle. In an example of N-type MOS transistor, the high-level part of the PWM signal is effective and the low-level part of the PWM signal is ineffective. As an example, FIG. 5 takes the high-level part represents an effective state, generally, the effective state indicates turning on and an ineffective state indicates turning off.

A turning-on period of the power switch includes following processes.

In a first process (t0-t1), the PWM signal of the power switch turns from the ineffective state to the effective state representing turning on, a voltage of a control terminal of the power switch begins to rise, as the voltage of the control terminal rises, the power switch begins to be gradually conductive and the current flowing through the power switch begins to rise and reaches a predetermined limited value.

In a second process (t1-t2), the voltage of the control terminal of the power switch is controlled to maintain the current flowing through the power switch at a limited value, the drain-source impendence of the power switch decreases and the drain-source voltage gradually decreases.

In a third process (t2-t3), the current flowing through the power switch drops from the limited value to a normal operation value, the voltage of the control terminal of the power switch is pulled up again to reach a maximum value, and the power switch is fully turned on at the time.

The above processes are just divided according to the waveform trendency but there is no strict boundary, and the use of processes is only for convenient illustration but not for limiting the scheme of the application.

Figure 6:
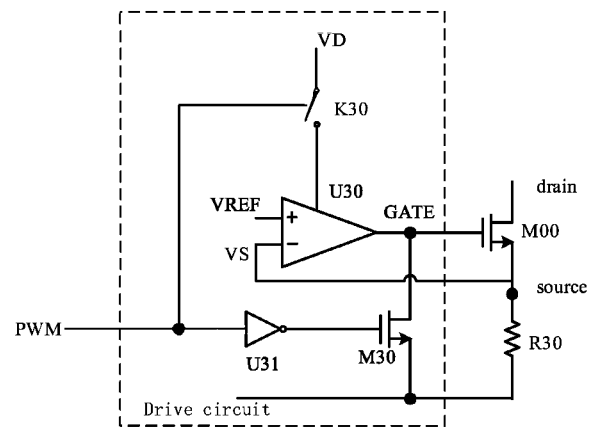
FIG. 6 is a schematic circuit diagram according to a first embodiment of the disclosure.

FIG. 6 shows a schematic circuit diagram according to a first embodiment of the disclosure. The circuit includes a drive circuit and the power switch M00. The drive circuit is used for driving the power switch M00 and the disclosure mainly solves the technical problem during the turning-on period of the power switch M00. The drive circuit includes a current limiting module and a logic control module. The logic control module receives the PWM signal, and the logic control module controls the current limiting module according to the PWM signal. When the PWM signal becomes low level, the logic control module controls the current limiting module not to operate, that means, the switch K30 is turned off for cutting off the supply of a supply voltage VD to the first operational amplifier U30, and the voltage of the control terminal GATE of the power switch M00 is pulled down (i.e., the NOT gate U31 is used for turning on the switch M30). When the PWM signal becomes high level, the logic control module controls the current limiting module begin to work, the switch K30 is turned on, the supply voltage VD is provided to the first operational amplifier U30 and the switch M30 is turned off at the time. The current limiting module includes the first operational amplifier U30, the first operational amplifier U30 has an first input terminal for receiving an current limiting reference signal VREF, a second input terminal for receiving a sampling signal VS representing the current flowing through the power switch M00, and an output terminal being connected with the control terminal of the power switch M00.

Referring to FIG. 5 and FIG. 6, the detailed procedure of the embodiment can be described as follows. When the PWM signal is low level, the switch M30 is turned on, the voltage of the control terminal GATE is pulled down, the MOS transistor (a type of power switch) M00 is turned off; when the switch K30 is turned off, the first operational amplifier U30 does not pull up the voltage of the control terminal GATE. Referring to FIG. 5, at time t0, the PWM signal turns from low level to high level, the switch M30 is turned off, the switch K30 is turned on, and the first operational amplifier U30 is enabled due to the supply voltage VD. The resistor R30 is used as a sampling resistor for sampling the current through the MOS transistor M00, and converting the current into voltage of the sampling signal VS, then supplying the sampling signal VS to a negative input terminal of the first operational amplifier U30. At time period from t0 to t1, the MOS transistor is not turned on, the current is basically equal to 0, thus, the voltage of the control terminal GATE begins to rise quickly. When the voltage of the control terminal GATE rises to some extent, the MOS transistor M00 is turned on and the current flowing through the MOS transistor M00 becomes large. At time t1, the current through the MOS transistor reaches the value of VREF/R30, and then at time period from t1 to t2, the first operational amplifier U30 adjusts the voltage of the control terminal GATE for maintaining the current through the MOS transistor at the limited value of VREF/R30. That is, during the time period from t1 to t2, the first operational amplifier U30 limits the current flowing through the MOS transistor, and the voltage of the control terminal GATE is basically unchanged, the limited value of VREF/R30 is larger than the normal operation current of the MOS transistor, and then the drain voltage of the MOS transistor drops. At time t2, the drain-source voltage of the MOS transistor is low enough so that the current flowing through the MOS transistor and the inductor current (referring to the inductor in FIG. 1) are approximately equal, and the voltage VS across the resistor R30 is also smaller than the reference voltage VREF. And then, the output voltage of the first operational amplifier U30 rises to pull up the GATE voltage of the MOS transistor. At time t3, the first operational amplifier U30 is under saturation condition, that is, the output voltage reaches a maximum value, and the MOS transistor M00 is fully conductive.

Figure 1:
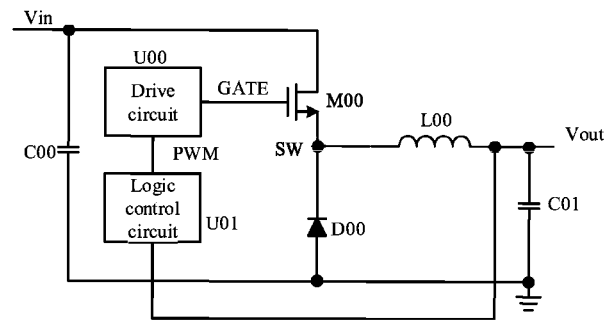
FIG. 1 is a schematic circuit diagram of an example buck circuit for a power switch according to the prior art.
Figure 2:
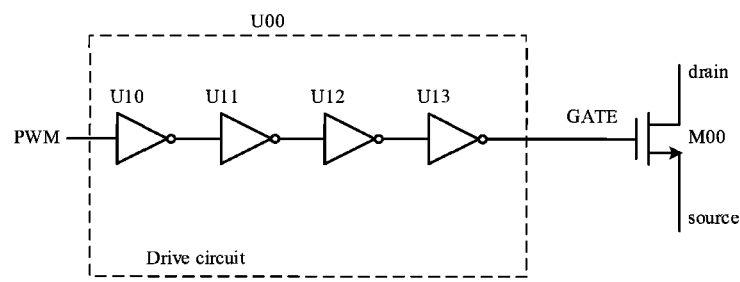
FIG. 2 is a schematic circuit diagram of an example drive circuit for a power switch according to the prior art.
Figure 3:
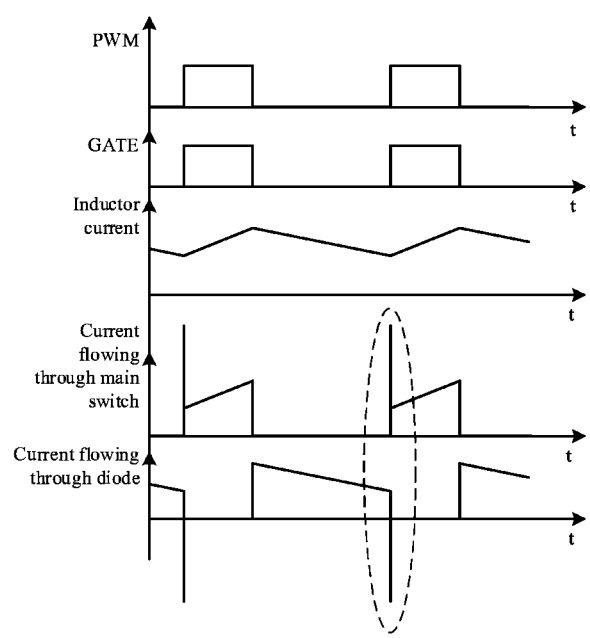
FIG. 3 is an operating waveform diagram of the buck circuit shown in FIG. 1.
Figure 4:
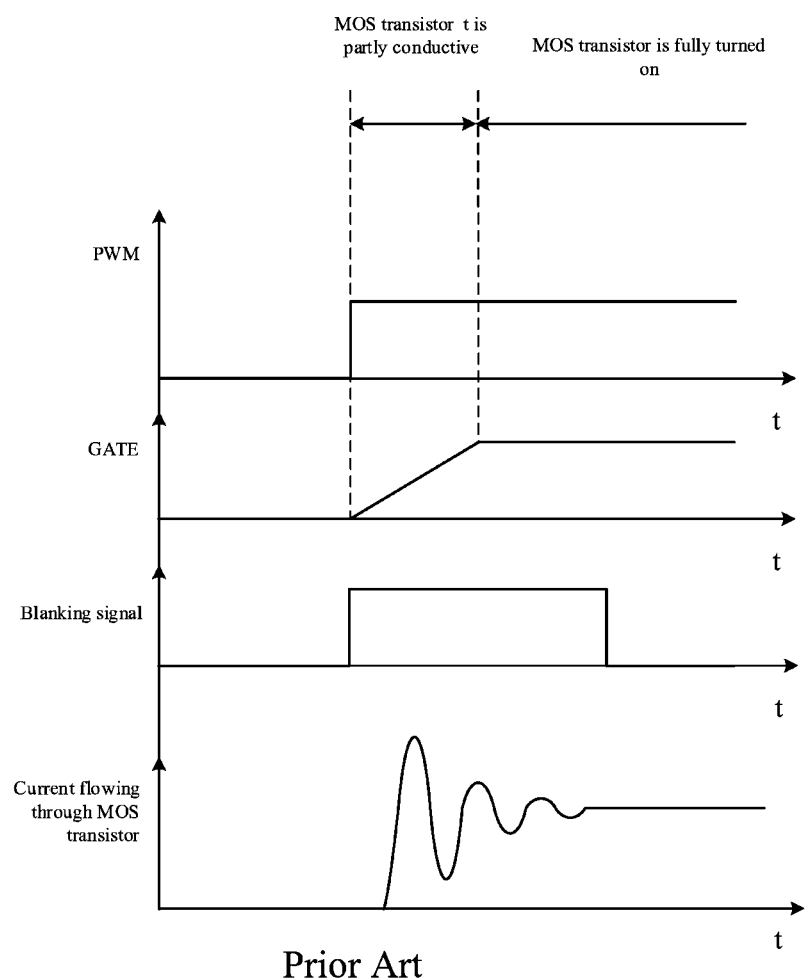
FIG. 4 is an amplification waveform diagram showing a turning-on period of the buck circuit according to FIG. 3.
Figure 11:
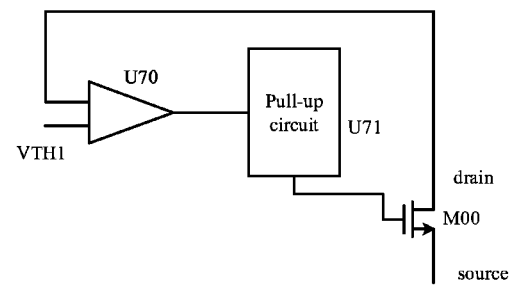
FIG. 11 is a schematic circuit showing connection relationship between a voltage comparator and a power switch.

The time period from t0 to t3 is usually a few ns to a few tens of ns, so that the operation of the operational amplifier is required to be very fast. Referring to FIG. 11, in order to decrease the time period from t2 to t3, an voltage comparator is added for detecting the drain-source voltage of the MOS transistor. When the drain-source voltage is low enough, the voltage of the control terminal of the MOS transistor is pulled up. Though FIG. 6 does not show the detail, the ordinary skilled in the art can know its embodiment. In some error cases, the point SW in FIG. 1 is shorted to ground, i.e., the freewheeling diode is shorted to ground, so that the drain-source voltage of the MOS transistor M00 is not decreased at time period t1 to t2 and the voltage of GATE is maintained at a certain value. Accordingly, referring to FIG. 12, a timing protection circuit can be added to the drive circuit for detecting the time period, when the drain-source voltage has not yet decreased after a certain time period, the drive circuit produce an alarm signal to turn off the MOS transistor. In these error cases, the current flowing through the MOS transistor is limited to VREF/R30, and thus, the system reliability is greatly improved. In normal turning-on period, current overshoot of the MOS transistor is limited to VREF/R30, and the overshoot and oscillation of the MOS transistor is reduced, so that the EMI performance and system reliability are greatly improved.

Figure 7:
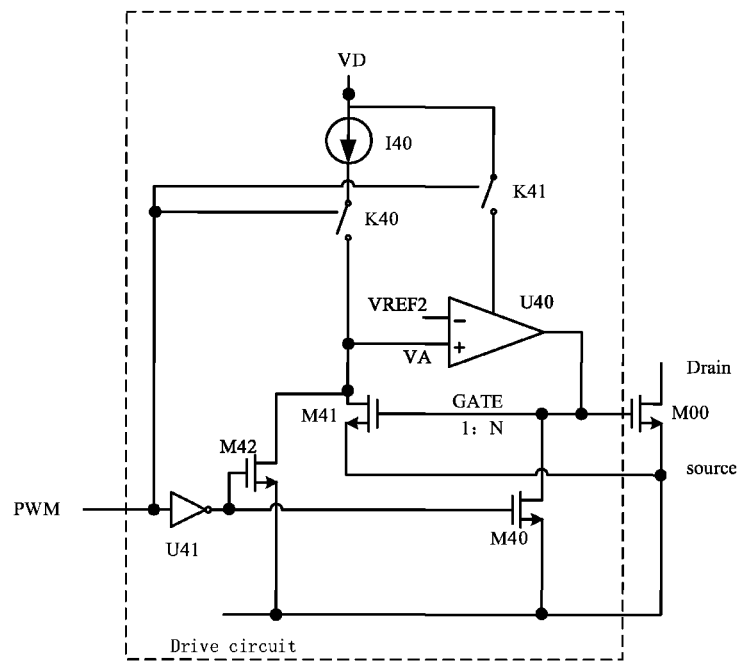
FIG. 7 is a schematic circuit diagram according to a second embodiment of the disclosure.

FIG. 7 is a schematic circuit diagram according to a second embodiment of the disclosure. In the first embodiment in FIG. 6, an additional voltage and power consumption are generated on the sampling resistor R30. The additional power consumption on the sampling resistor is relatively large, especially in low-voltage and high-current applications, and it affects the applications of the scheme. On basis of this, the second embodiment in FIG. 7 uses a circuit structure having no the sampling resistor, differing from the current limiting module shown in FIG. 6, so that the additional power consumption is greatly reduced.

The power switch M41 is used as an auxiliary power switch, and constitutes a current mirror with the power switch M00. In saturation area, the current flowing through M41 is 1/N of the current flowing through M00. The power switch M41 and the first operational amplifier U40 constitute the current limiting module. The waveform of the current flowing through the MOS transistor M00 is same with that in FIG. 5. However, the limited value of the current through the MOS transistor M00 in FIG. 7 is the product of N and the current from a current source I40, not the previous VREF/R30, that is, the limited values are in different forms. When the PWM signal is low level, M40 and M42 are turned on, the voltages of the control terminal GATE and the negative terminal voltage VA are pulled down, the switches K40 and K41 are turned off, the voltage VA is not pulled up by the current source I40, the operational amplifier U40 (i.e., the first operational amplifier in the second embodiment) is not enabled, and the gate voltage of the control terminal GATE of the MOS transistor is low. When the PWM signal turns from low to high, M40 and M42 are turned off, the switches K40 and K41 are turned on, the current source I40 turns up the voltage VA, and the operational amplifier U40 is enabled. When the PWM signal is low level, the gate voltages of M00 and M41 at GATE are low, so that when the PWM signal jumps to high level, the current flowing through M00 and the current flowing through M41 are relatively small due to the low voltage at GATE, the voltage VA is pulled up by the current source I40, the output voltage of the operational amplifier U40 rises to pull up the voltage at GATE, that is the time period from t0 to t1. It is noted that K40 and M42 are not necessary, because K41 can be used for controlling the output voltage of U40 when the PWM signal is low level. In other words, the scheme using M41 and K40 and the scheme using K41 are alternative embodiments, any one of them can implement the corresponding function. But in the embodiment, for convenient illustration, they are shown in one diagram.

When the voltage at GATE rises to some extent, the current flowing through the M41 reaches the current from I40, that is, the current through the M00 is the product of N and the current from I40, the voltage VA is controlled by the operational amplifier U40 to be equal to VREF2, the current flowing through M41 is maintained to the current from I40, the current through M00 is maintained to the product of N and the current from I40, and the voltage at GATE is basically unchanged. At time t2, the drain-source voltage of M00 drops low enough so that it reaches a predetermined threshold value, the current flowing through M00 is smaller than the product of N and the current from I40, the voltage VA rises, the output voltage of the operational amplifier U40 increases, the voltage at GATE rises, until the operational amplifier U40 is saturated and the output voltage of the operational amplifier U40 rises to a maximum value, the MOS transistor M00 is fully conductive at the time.

In FIG. 7, the NOT gate U41, switches M42 and M40, switches K40 and K41 constitute the logic control circuit according to the embodiment, which is used for controlling the current limiting module and the power switch after receiving the PWM signal. The detailed connection is shown in FIG. 7, and will not repeated here.

Figure 8:
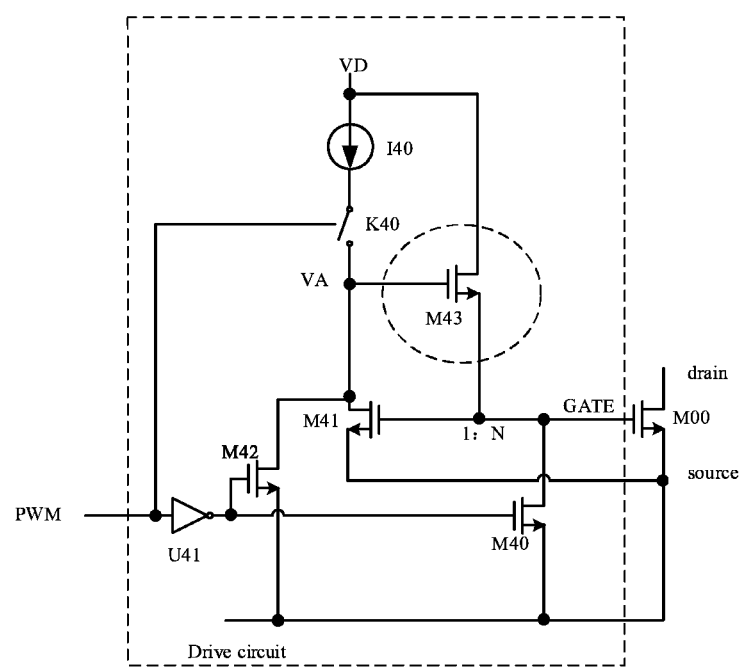
FIG. 8 is a schematic circuit diagram according to a third embodiment of the disclosure.

FIG. 8 is a schematic circuit diagram according to a third embodiment of the disclosure. The operational amplifier U40 and reference voltage VREF2 in FIG. 7 can be implemented by a NMOS transistor M43 which can be used as a second switch. As referring to FIG. 8, the NMOS transistor M43 is marked by a dashed box. When the PWM signal turns from low to high, the current flowing through M41 and the current flowing through M00 are equal to 0 and the voltage at GATE is low, so that the voltage VA (i.e., the gate voltage of M43) rises to increase the source voltage of M43 (i.e., the voltage at GATE rises). When the voltage at GATE rises to some extent, the current flowing through M41 reaches the current from I40, and then the gate-source voltage of M43 drops, the current flowing through M43 decreases, the voltage at GATE is maintained at a certain value so that the current through M41 is equal to the current from I40. When the drain voltage of M00 is low enough, the current flowing through M00 is less than the product of N and the current from I40, then voltage VA is pulled up by the current source I40, M43 is fully conductive, the voltage at GATE is pulled up to VD-Vgs (M43), and the MOS transistor M00 is fully conductive. It should be noted that a switch being coupled to M43 in series can be used for controlling M43 instead of K40 and M42, and it is particularly pointed out here.

In FIG. 8, the NOT gate U41, switches M42, M40 and K40 constitute the logic control circuit according to the embodiment, which is used for controlling the current limiting module and the power switch after receiving the PWM signal. The detailed connection is shown in FIG. 7, and will not repeated here.

Figure 9:
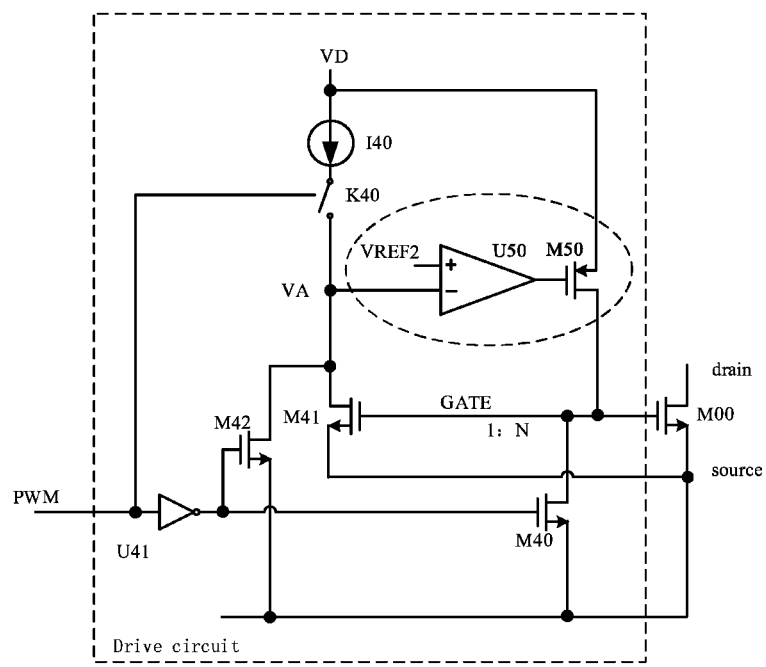
FIG. 9 is a schematic circuit diagram according to a fourth embodiment of the disclosure.

FIG. 9 is a schematic circuit diagram according to a fourth embodiment of the disclosure. In the third embodiment shown in FIG. 8, the N-type MOS transistor M43 is used for pulling up the voltage at GATE, so that the maximum voltage at GATE can only reach VD-Vgs, but not to the supply voltage VD. In order to pull up the voltage at GATE to reach the supply voltage and then further reduce the on-resistance of the main MOS transistor M00, a P-type MOS transistor can be used as the output, that is, a P-type MOS transistor M50 (as the second switch) and a second operational amplifier U50 replace M43 in the third embodiment. In addition, similarly to the third embodiment, it is possible to use a switch being connected in series with M50 instead of K40 and M42 so that M50 is turned off when the PWM signal is low level (representing an ineffective state). When the PWM signal is low level, M40 is turned on, the voltage at GATE is 0, and M00 is turned off. Meanwhile, the voltage VA is pulled down to low by M42, the output voltage of U50 is high, the P-type MOS transistor M50 is turned off and the voltage at GATE is not pulled up. When the MOS transistor M00 is fully conductive, the voltage VA is pulled up by the current source I40, U50 outputs a minimum voltage, M50 is fully conductive, and the voltage at GATE is pulled up to VD. Other processes are similar to that of the previous-described circuit, and will not described in detail here.

Figure 10:
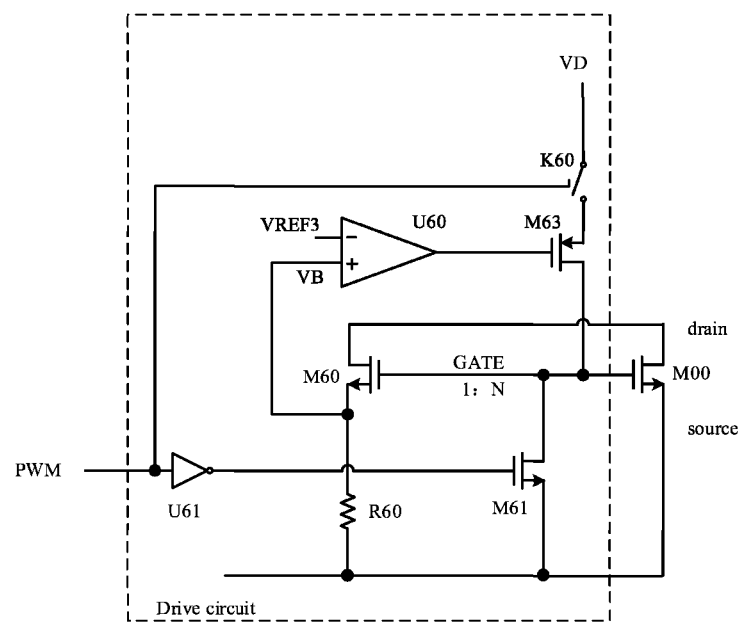
FIG. 10 is a schematic circuit diagram according to a fifth embodiment of the disclosure.

FIG. 10 is a schematic circuit diagram according to a fifth embodiment of the disclosure. In the second to fourth embodiments, a current mirror is used to sample the current flowing through the main MOS transistor M00, and M41 and M00 constitute the current mirror. In the embodiment shown in FIG. 10, the drain electrodes of the auxiliary power switch M60 and M00 are connected together, so that the voltage drop across R60 represents the current flowing through M00. And in FIG. 10, the voltage at GATE is pulled up by the P-type MOS transistor according to the fourth embodiment, so that the voltage at GATE can reach the supply voltage VD. The source electrode of M60 is connected to the source electrode of M00 through the sampling resistor R60. Because the current flowing through M60 is much smaller than the current flowing through M00, the power consumption of R60 does not affect the system efficiency. When the PWM signal is low level, M61 is turned on, the voltage at GATE is pulled down, and K60 is turned off, so M63 (as the second switch) does not pull up the voltage at GATE. R60 can be a resistor, or a MOS transistor operated in a linear region. The reference signal VREF3 in the embodiment differs from the reference signal in other embodiments, that is, the reference signals in each embodiment represent different values, but all of them function as reference, and it is particularly pointed out here.

FIG. 11 is a schematic circuit showing connection relationship between a voltage comparator and a power switch. The voltage comparator U70 is added to the drive circuit, and the voltage comparator U70 receives the drain-source voltage of the power switch M00 (due to the source being grounded and an input terminal of U70 being connected to the drain electrode of M00, the drain voltage is representative of the drain-source voltage), the drain-source voltage is compared with a determined threshold value VTH1, when the drain-source voltage drops to the threshold value VTH1, the MOS transistor is pulled up by a pull-up circuit, that is, by rapidly pulling up the voltage of the control terminal voltage of the power switch M00 to fully turn on the power switch M00.

Figure 12:
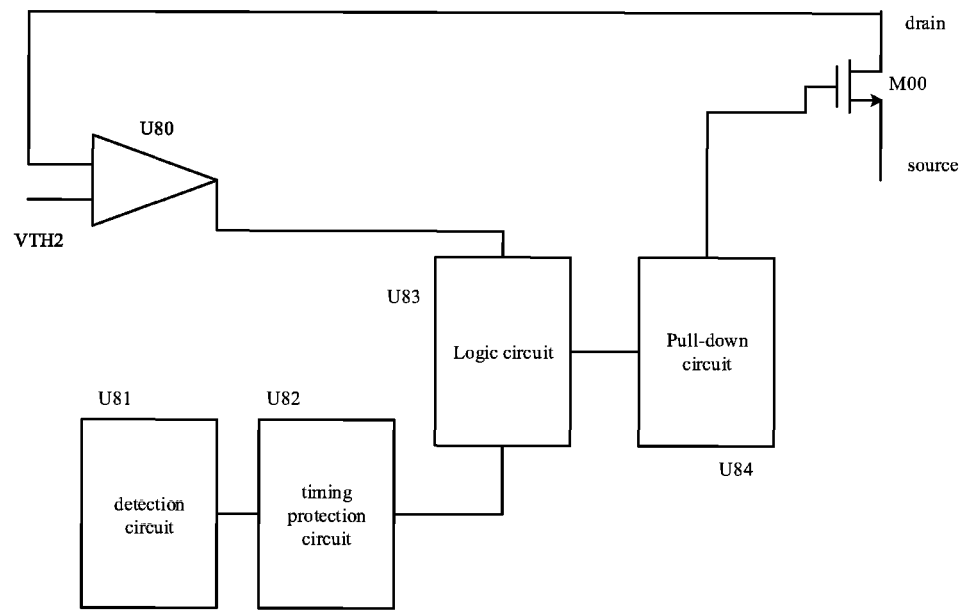
FIG. 12 is a schematic circuit showing connection relationship of a timing protection circuit.

FIG. 12 is a schematic circuit showing connection relationship of a timing protection circuit. The timing protection circuit U82 is added to the drive circuit. When the current through the power switch M00 is maintained to the limited value, a U81 detects the limited current, the timing protection circuit U82 configures a time threshold, if the drain-source voltage (due to the source being grounded and an input terminal of U70 being connected to the drain of M00, the drain voltage is representative of the drain-source voltage) has not decreased when time is over the time threshold, the logic control circuit U83 turns off the power switch M00 through the pull-down circuit U84 for protecting the power switch M00. If the drain-source voltage has not decreased when time is over the time threshold, the comparator U80 is used for determination, and VTH2 is used as a reference voltage in comparison, so the scheme can be implemented when a reasonable value of VTH2 has been set in accordance with the value of the drain-source voltage prior to the decrease of the drain-source voltage.

The PWM signal according to the embodiments of the present disclosure is a pulse width modulation signal for controlling the power switch, but the PWM signal is only one type of the control signals of the present disclosure, and the control signals can be of other types.

Figure 13:
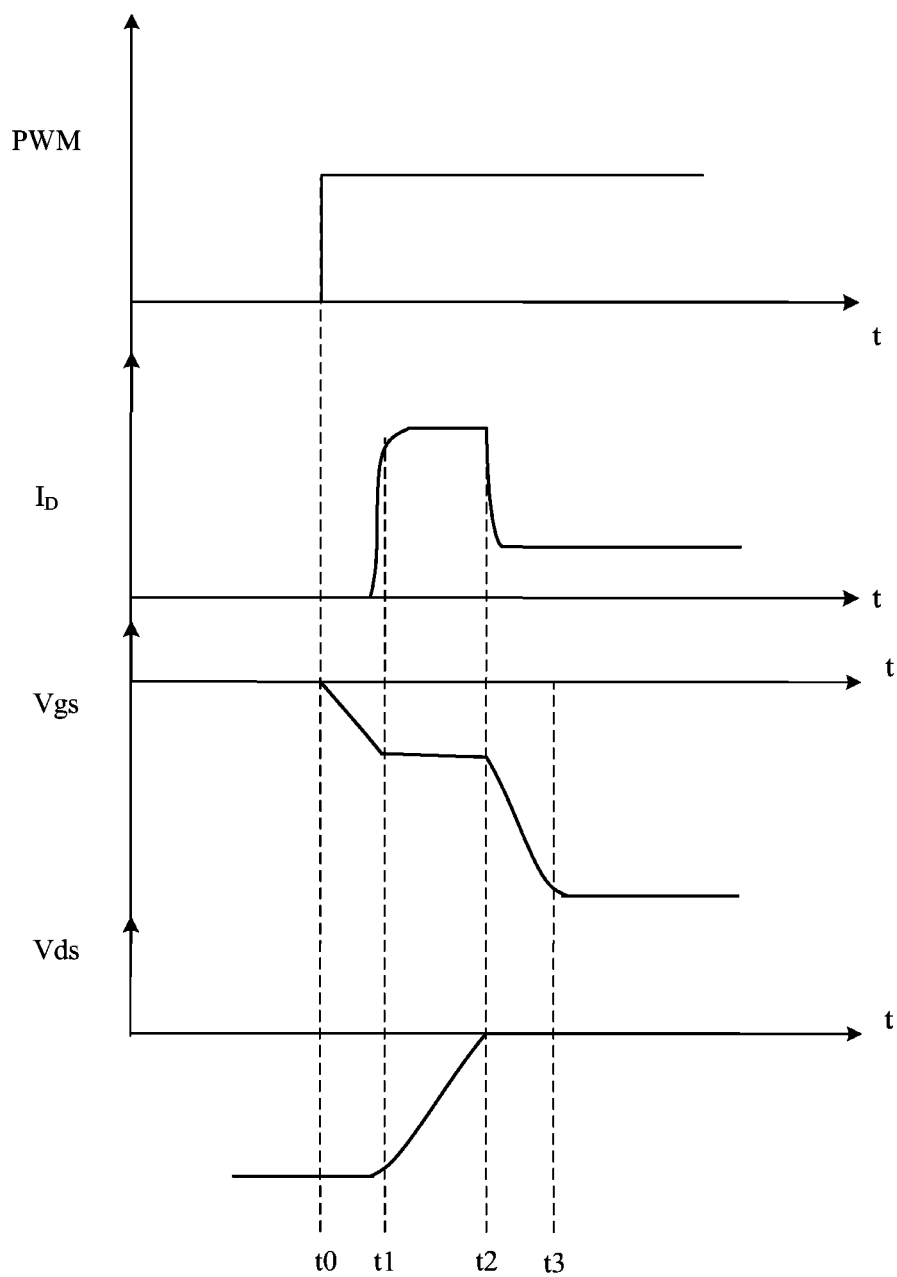
FIG. 13 is another operating waveform diagram of a drive circuit according to an embodiment of the disclosure.

FIG. 13 are waveform diagram showing the waveforms of the PWM signal, the current $I_D$ flowing through the main switch, the gate-source voltage Vgs, and the drain-source voltage Vds in the application of the present disclosure, which mainly reflects the waveforms during the turning-on period. A PWM signal can be used as a manner of controlling a main power switch. The PWM signal includes an effective part and an ineffective part, which constitute a switching cycle, the ratio of the effective part to the whole switching cycle is referred to as duty cycle. In the present embodiment, the high-level part of the PWM signal is effective and the low-level part is ineffective. The PWM signal is not provided to the control terminal of the main switch, the PWM signal represents the turning-on and turning-off time instant. The gate voltage of the main switch is finally obtained by logic calculation in accordance with the PWM signal, so that the low-level part of the PWM signal can be made effective and high-level part can be made ineffective by logic configuration, and for the different types of main switches, the PWM signal in the embodiment can implement corresponding functions. So obviously, the level states of the PWM signal in the present embodiment does not limit the embodiment. As an example, in the figures, the high-level part is representative of an effective state. Generally, the above-mentioned effective state means turning on a switch, and the ineffective state means turning off a switch. In this embodiment, as an example, the P-type MOS transistor is used as the main switch, the control terminal (i.e., the gate terminal) of which is generally is turned on by low-level signal and turned off by high-level signal, whereas the PWM signal uses the high-level part as an effective state, at this case, through logic configuration or logic modification, the gate terminal can be turned on by low-level signal. It is particularly pointed out here.

A turning-on period of the main switch includes following processes.

A first process (t0-t1), in which a gate-source voltage of the main switch starts to decrease when the PWM signal turns from an ineffective state to an effective state representing turning on, the main switch begins to be gradually conductive with the decrease of the gate-source voltage, the current flowing through the main switch begins to increase and reaches a predetermined limited value.

A second process (t1-t2), in which the current flowing through the power switch is maintained to a limited value by controlling the gate-source voltage of the main switch, the drain-source impedance of the main switch drops and the absolute value of drain-source voltage of the main switch continuously decreases.

A third process (t2-t3), in which the current flowing through the main switch drops from a limited value to a normal operation value, the gate-source voltage of the power transistor drops again until the absolute value of the gate-source voltage reaches a maximum value, and at the time, the main switch is fully conductive.

The above processes are divided according to waveform trendency but there is no strict boundary, and the use of processes is only for convenient description but is not for limiting the scheme of the application. With regard to the "main" switch, the "main" is only necessary for the distinction, that is, the main switch is the switch to be controlled and driven in this application. Of course, in the actual applications, it is also commonly known as a main switch. The normal operating current is the operating current in the actual circuit, and the different applications may have different operating current and they don't have specific values. The biggest difference between the scheme shown in FIG. 13 and the scheme shown in FIG. 5 is that the types of MOS transistors are different which results in different variation trendency of the drive voltage. The specific circuit and scheme shown in FIG. 13 can refer to the circuit shown in FIG. 5. One ordinary skilled in the art will implement the relevant circuits in accordance with the instruction of the present disclosure.

While the embodiments have been described and illustrated separately, it is apparent to those skilled in the art that the common parts can be replaced and integrated between embodiments, and the content that is not explicitly described in one embodiment can refer to another embodiment which explicitly describes the content. The power switch in the present disclosure can be applied to various topologies while the drive circuits and methods thereof can be implemented in a variety of applications and are not limited to buck circuits.

The preferred embodiments of the present invention are described in the above paragraphs, but not construed as limiting the present invention. Many modifications, equivalence, variations of the preferred embodiments can be made without departing from the doctrine and spirit of the present invention.

The invention claimed is:

1. A drive method for turning a power switch from off to on during a turning-on period, comprising a first process, a second process and a third process, wherein a control terminal of said power switch is connected to a current limiting module and a logic control module, wherein:

during the first process, when control signal turns from an ineffective state to an effective state representing turning on, a voltage of said control terminal of said power switch starts to increase, and, as said voltage of said control terminal increases, said power switch begins to be gradually conductive, and a current flowing through said power switch begins to increase from zero and reaches a predetermined limited value;

during the second process, said voltage of said control terminal of said power switch is controlled by said current limiting module for maintaining said current flowing through said power switch at said limited value, drain-source impedance of said power switch is reduced and a drain-source voltage of said power switch gradually decreases; and during the third process, said current flowing through said power switch decreases from said limited value to a normal operation value, said voltage of said control terminal of said power switch is pulled up again to reach a maximum value, and said power switch is fully turned on at said time, wherein, said control signal is a PWM signal, said current limiting module is configured to obtain power supply directly through a switching transistor having a control terminal receiving said PWM signal, when said PWM signal is under said ineffective state, said switching transistor is turned off by said PWM signal, thus no current flows from said switching transistor to said current limiting module and said current limiting module is disabled, and said logic control module is configured to switch off said power switch in accordance with said PWM signal, when said PWM signal is under said effective state, said switching transistor is turned on by said PWM signal, thus said current limiting module is enabled by receiving a supply current directly provided by said turned-on switching transistor, so that said current limiting module controls said voltage of said control terminal of said power switch in accordance with a sampling signal representing said current flowing through said power switch.

2. The drive method according to claim 1, further comprising: detecting said drain-source voltage of said power switch, wherein, when said drain-source voltage gradually decreases to reach a first threshold value, said voltage of said control terminal of said power switch is quickly pulled up to fully turning on said power switch.

3. The drive method according to claim 1, wherein that said voltage of said control terminal of said power switch is controlled for maintaining said current flowing through said power switch at said limited value comprises:

sampling said current flowing from said power switch;
performing error treatment on signals obtained by sampling and a predetermined reference value; and
adjusting said voltage of said control terminal of said power switch for controlling said current flowing through said power switch equal to said limited value in accordance with the result of said error treatment.

4. The drive method according to claim 1, wherein, that said voltage of said control terminal of said power switch is controlled for maintaining said current flowing through said power switch at said limited value comprises:

providing an auxiliary power switch, said auxiliary power switch and said controlled power switch constitute a current mirror which is used to maintain said current flowing through said power switch at said limited value by limiting a current flowing through said auxiliary power switch.

5. A drive circuit for turning a power switch from off to on during a turning-on period, wherein said drive circuit comprises:

a current limiting module, connected to a control terminal of said power switch; and a logic control module, connected to said control terminal of said power switch, wherein said drive circuit receives a control signal, during said turning-on period, when said control signal turns from an ineffective state to an effective state representing turning on, a voltage of said control terminal of said power switch starts to increase, said current limiting module begins to operate, and as said voltage of said control terminal increases, said power switch begins to be conductive gradually, said current flowing through said power switch is increased from zero and reaches a predetermined limited value under adjustment of said current limiting module;

said voltage of said control terminal of said power switch is controlled by said current limiting module for maintaining said current flowing through said power switch at said limited value, said drain-source impedance of said power switch is reduced and a drain-source voltage of said power switch gradually decreases;

and said current flowing through said power switch decreases from said limited value to a normal operation value, said voltage of said control terminal of said power switch is pulled up again to reach a maximum value, and said power switch is fully turned on at said time, wherein, said control signal is a PWM signal, said current limiting module is configured to obtain power supply directly through a switching transistor having a control terminal receiving said PWM signal, when said PWM signal is under said ineffective state, said switching transistor is turned off by said PWM signal, thus no current flows from said switching transistor to said current limiting module and said current limiting module is disabled, and said logic control module is configured to switch off said power switch in accordance with said PWM signal, when said PWM signal is under said effective state, said switching transistor is turned on by said PWM signal, thus said current limiting module is enabled by receiving a supply current directly provided by said turned-on switching transistor, so that said current limiting module controls said voltage of said control terminal of said power switch in accordance with a sampling signal representing said current flowing through said power switch.

6. The drive circuit according to claim 5, wherein said logic control module controls said current limiting module not to operate and pulls down said voltage of said control terminal of said power switch when said control signal is ineffective, and controls said current limiting module begin to operate when said control signal is effective.

7. The drive circuit according to claim 5, wherein said current limiting module comprises:

a first operational amplifier which has a first input terminal for receiving a current limiting reference signal, a second input terminal for receiving said sampling signal representing said current flowing through said power switch, and an output terminal being connected to said control terminal of said power switch.

8. The drive circuit according to claim 5, further comprising:

a voltage comparator,
wherein said voltage comparator receives a drain-source voltage of said power switch, and compares said drain-source voltage with a predetermined first threshold value, when said drain-source voltage is smaller than said first threshold value, said voltage of said control terminal of said power switch is pulled up quickly to fully turn on said power switch.

9. The drive circuit according to claim 5, further comprising:

a timing protection circuit,
wherein a time threshold is set by said timing protection circuit when said current flowing through said power switch is maintained at said limited value, and when time is over said time threshold but said drain-source voltage does not begin to decrease, said power switch is controlled to be turned off for protecting said power switch.

10. The drive circuit according to claim 5, wherein said current limiting module comprises:

an auxiliary power switch and a first operational amplifier,
said auxiliary power switch and said controlled power switch constitute a current mirror, said first operational amplifier has a first input terminal for receiving a reference signal, a second input terminal being connected with a first terminal of said auxiliary power switch, and an output terminal being connected with said control terminal of said power switch, and said first terminal of said auxiliary power switch receives said current from a first current source when said control signal represents an effective state.

11. The drive circuit according to claim 5, wherein said current limiting module comprises:
an auxiliary power switch and a first switch,
said auxiliary power switch and said controlled power switch constitute a current mirror, said first switch has a first terminal for receiving a supply voltage, a second terminal being connected with said control terminal of said power switch, and an control terminal being connected with a first terminal of said auxiliary power switch, and said first terminal of said auxiliary power switch receives said current from a first current source when said control signal represents an effective state.

12. The drive circuit according to claim 11, wherein said first switch is an N-type MOS transistor.

13. The drive circuit according to claim 6, wherein said current limiting module further comprises:
an auxiliary power switch, a second switch and a second operational amplifier,
said auxiliary power switch and said controlled power switch constitute a current mirror, said second switch has a first terminal being connected with said control terminal of said power switch, a second terminal for receiving a supply voltage and a control terminal being connected with an output terminal of said second operational amplifier, said second operational amplifier has a first input terminal for receiving a reference signal and a second input terminal being connected with said first terminal of said power switch, and a first terminal said auxiliary power switch receives current from a first current source when said control signal represents an effective state.

14. The drive circuit according to claim 6, said current limiting module comprises: an auxiliary power switch, a second switch and a second operational amplifier,
wherein said driver circuit adjusts said current flowing through said controlled power switch by adjusting said current flowing through said auxiliary power switch, said second operational amplifier has a first input terminal for receiving a reference signal representing a limited value of said current flowing through said auxiliary power switch, a second input terminal for receiving a sampling signal representing said current flowing through said auxiliary power switch, and an output terminal being connected with said control terminal of said power switch; said second operational amplifier has an output terminal being connected with a control terminal of said second switch; and said second switch has a first terminal being connected with said control terminal of said power switch and a second terminal for receiving a supply voltage.

15. The drive circuit according to claim 13, wherein said second switch is a P-type MOS transistor.

16. A power supply system, comprising: a drive circuit for a power switch according to claim 5.

17. A drive method for turning a switch from off to on during a turning-on period, comprising a first process, a second process and a third process, wherein a gate of said switch is connected to a current limiting module and a logic control module, wherein:
during the first process, when a control signal turns from an ineffective state to an effective state representing turning on, a gate-source voltage of said switch starts to decrease, said switch begins to be gradually conductive when said gate-source voltage decreases, a current flowing through said switch begins to increase from zero and reaches a predetermined limited value;
during the second process, said gate-source voltage of said switch is controlled by said current limiting module in order to maintain said current flowing through said switch at said limited value, a drain-source impedance of said main switch drops, thus an absolute value of drain-source voltage of said switch gradually decreases; and
during the third process, said current flowing through said switch drops from said limited value to a normal operation value, said gate-source voltage of said switch drops again until said absolute value of said gate-source voltage reaches a maximum value, and said switch is fully conductive at said time,
wherein, said control signal is a PWM signal, said current limiting module is configured to obtain power supply directly through a switching transistor having a control terminal receiving said PWM signal,
when said PWM signal is under said ineffective state, said switching transistor is turned off by said PWM signal, thus no current flows from said switching transistor to said current limiting module and said current limiting module is disabled, and said logic control module is configured to switch off said power switch in accordance with said PWM signal,
when said PWM signal is under said effective state, said switching transistor is turned on by said PWM signal, thus said current limiting module is enabled by receiving a supply current directly provided by said turned-on switching transistor, so that said current limiting module controls said voltage of said control terminal of said power switch in accordance with a sampling signal representing said current flowing through said power switch.

* * * * *